United States Patent [19]

Kim

[11] Patent Number: 5,796,468
[45] Date of Patent: Aug. 18, 1998

[54] APPARATUS USED TO ALIGN AND MARK WAFERS

[75] Inventor: Kwang Chul Kim, Kyungsangbook-Do, Rep. of Korea

[73] Assignee: LG Semicon Co., Ltd., Cheongju, Rep. of Korea

[21] Appl. No.: 822,472

[22] Filed: Mar. 24, 1997

Related U.S. Application Data

[63] Continuation-in-part of Ser. No. 581,354, Dec. 28, 1995, abandoned.

[30] Foreign Application Priority Data

Nov. 2, 1995 [KR] Rep. of Korea ............ 39347/1995

[51] Int. Cl.⁶ ................................................. G03B 27/42
[52] U.S. Cl. .............................................................. 355/53
[58] Field of Search ................................ 355/43, 67, 71

[56] References Cited

U.S. PATENT DOCUMENTS 4,880,293  11/1989  Gilliland et al. .................. 355/71 X
5,160,957  11/1992  Ina et al. ............................ 355/53 X
5,262,822  11/1993  Kosugi et al. ......................... 355/53
5,309,198   5/1994  Nakagawa ......................... 355/53 X
5,386,269   1/1995  Kosugi .............................. 355/53 X
5,489,966   2/1996  Kawashima et al. .............. 355/53 X

FOREIGN PATENT DOCUMENTS 3341 747 A1  5/1984  Germany ................ H01L 21/68
3527 855 A1  8/1986  Germany ................ H01L 21/32
6-140305 A   5/1994  Japan ................... H01L 21/027

*Primary Examiner*—Fred L. Braun
*Attorney, Agent, or Firm*—Fleshner & Kim

[57] ABSTRACT

An apparatus of the present invention includes a stage for moving a wafer in a first prescribed direction, an aligner and a marking apparatus. The aligner aligns patterns exposed by a light onto the wafer. A marking apparatus coupled to the aligner and using the light from the aligner exposes identification markings onto the wafer. Consecutive alignment and marking can be performed in the apparatus.

7 Claims, 2 Drawing Sheets

APPARATUS USED TO ALIGN AND MARK WAFERS

This application is a continuation-in-part application of application Ser. No. 08/581,354 filed Dec. 28, 1995, now abandoned.

BACKGROUND OF THE INVENTION

1. Field of the Invention

The present invention relates to an aligner and a marking apparatus, and in particular to, an apparatus having an improved aligner equipped with a marking apparatus capable of decreasing fabrication cost and increasing productivity by concurrently performing an aligning process and a marking process with respect to the exposure.

2. Description of the Conventional Art

Generally, it is necessary to perform an aligning process using aligner before an exposure process is performed during a semiconductor wafer fabrication process. After the exposure process, a marking process is performed, which is directed to marking a certain information such as a lot number and the like on a wafer.

FIG. 1 shows a conventional marking apparatus, which includes a mask 2 having various characters is disposed below a high pressure mercury lamp 1 which generates a certain light for a character printing. A lens 3 is disposed below the mask 2 for projecting the light generated by the high pressure mercury lamp 1 onto a wafer W.

In addition, a processing unit 4 is disposed below the lens 3 for printing various characters on a surface of the wafer W. A sender 5 is disposed at one side of the processing unit 4 for loading the wafer W, and a receiver 6 is disposed at the other side of the processing unit 4 for unloading the wafer W.

To begin with, when the wafer W is transferred to the processing unit 4, a certain character to be printed on the wafer W is selected. When the certain character selection is completed, the character is printed on the wafer W by reacting the photosensitive material coated thereon in cooperation with the mask 2, the lens 3, and the high pressure mercury lamp 1.

However, the conventional marking process which is performed after the exposure process has a disadvantage in that since it is performed independently from the aligning process, the productivity is decreased.

SUMMARY OF THE INVENTION

Accordingly, it is an object of the present invention to provide an aligner equipped with a marking apparatus, which overcome the problems encountered in a conventional aligner equipped with a marking apparatus.

It is another object of the present invention to provide an improved aligner equipped with a marking apparatus capable of decreasing fabrication cost and increasing productivity by concurrently performing an aligning process and a marking process with respect to the exposure.

To achieve the foregoing objects, features and advantages, the present invention includes an apparatus comprising a stage for moving a wafer in a first prescribed direction; an aligner for aligning patterns exposed by a light onto the wafer; and a marking apparatus coupled to the aligner and using the light from the aligner for exposing identification markings onto the wafer, wherein consecutive alignment and marking are performed in the apparatus.

DETAILED DESCRIPTION OF THE INVENTION

Figure 1:
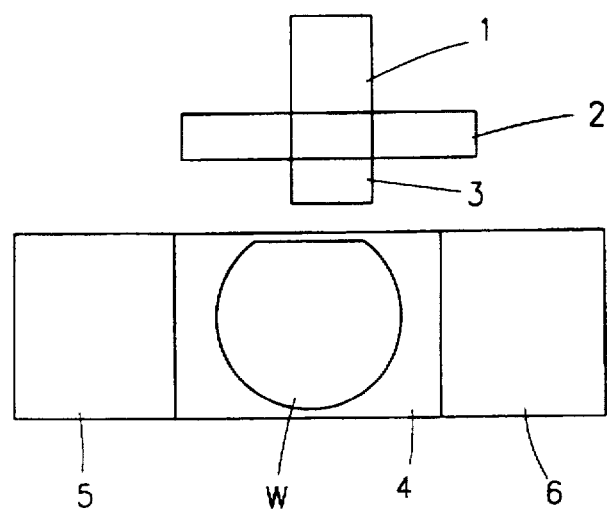
FIG. 1 is a plan view showing a conventional marking apparatus.
Figure 2:
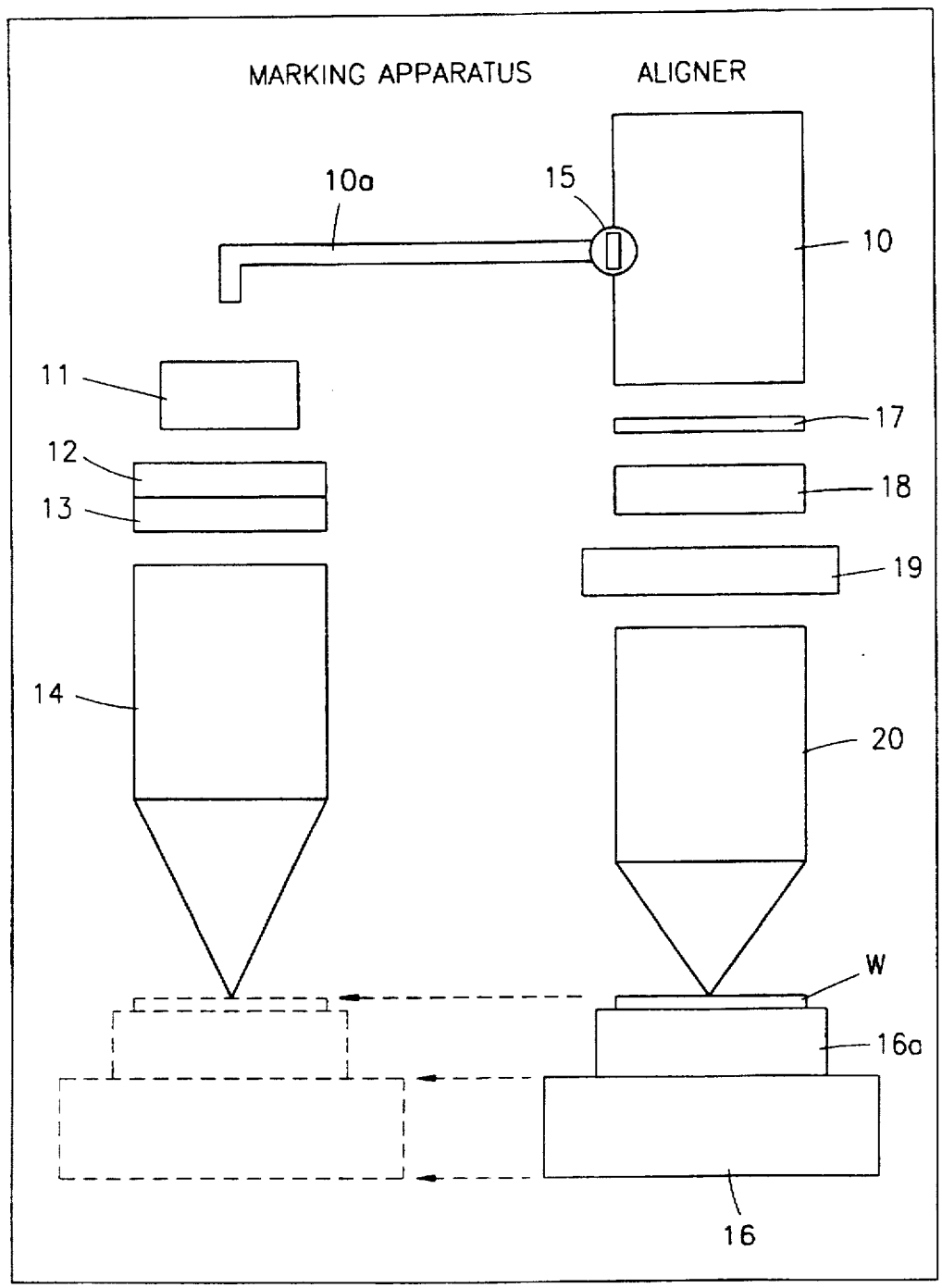
FIG. 2 is a plan view showing an apparatus with both an aligner and a marking apparatus a marking apparatus according to the present invention.

FIG. 2 shows an apparatus with both an aligner and a marking apparatus. The marking apparatus comprises an illuminator 10 having an optical cable 10a disposed at a predetermined portion of the system. A diffusion lens 11 is disposed below the optical cable 10a for diffusing light transmitted thereto, and a mask module 12 has various characters to be printed is disposed below the diffusion lens 11. For example, the mask module 12 may be a circular frame with letters and/or numbers inscribed therein for exposing identification markings onto the wafer. A mask stage 13 is disposed below or above the mask module 12 for selectively driving the mask module 12, e.g., the mask stage 13 allows the rotation of the mask module 12 in the θ direction. A lens 14 is disposed below the mask stage 13 for transmitting light to the wafer W, and a shutter 15 is disposed below the lens 14 or between the illuminator 10 and optical cable 10a for blocking light transmitted thereto for a predetermined period of time, e.g., the shutter 15 opens and closes to apply the light from the illuminator 10 to the wafer W or to the optical fiber 10a, and a stage 16 having a chuck 16a is disposed below the shutter 15 for moving the wafer W, e.g., the stage 16 allows the movement of the wafer W in the X, Y and θ axis directions.

The aligner also uses the light from the illuminator 10. In the preferred embodiment, the illuminator 10 may employ a high voltage mercury lamp to emit the light. A reticle 17 includes patterns thereon for inscribing such patterns onto the wafer W during the etching process. The reticle may be a glass frame having a size of 5 in.×6 in. An alignment system employs a laser system for allowing alignment of the reticle 17 with the wafer W, and a reticle stage 18 allows movement of the reticle 17 in the X, Y, and θ directions. A stepper U lens 20 transmits light onto the wafer W by downsizing the pattern image of the reticle 17 by, e.g., ⅕.

The operation of the aligner equipped with a marking apparatus will now be explained with reference to the accompanying drawing.

To begin with, when the wafer W is placed on the upper surface of the chuck 16a disposed on the upper surface of the stage 16, and the stage 16 moves for an alignment. Using the aligner, the pattern on the reticle 17 is aligned with the wafer W. The illuminator 10 provides the light, which passes through the reticle 17, reticle stage 18, alignment system 19 and stepper U lens 20 for exposing the pattern of the reticle 17 onto the wafer W which is inscribed during the etching process of the semiconductor fabrication. The reticle stage 18 moves the reticle 17 in the X, Y and θ direction. Similarly, the stage 16 moves the wafer W in the X, Y and θ directions. Using the laser system of the alignment system 19, the reticle stage 18 and the stage 16 are moved in the X, Y and θ directions to align the wafer W and the pattern of the reticle 17, which has been shrunk by the stepper U lens 20.

In addition, when the shutter 15 of the lens 14 is opened, light from the illuminator 10 is transmitted onto the photosensitive material coated on the upper surface of the wafer W through the diffusion lens 11, the mask 12, and the lens 14, so that a marking process is performed by reacting the photosensitive material in cooperation with the light transmitted thereto.

In this embodiment, it is directed to concurrently executing the aligning process and the marking process before the exposure process, however, it is not limited thereto in implementing the objects of the present invention. In another embodiment, the marking process can be executed at a certain stage after the alignment and exposure in one system.

As described above, the aligner equipped with a marking apparatus is directed to concurrently performing the marking process and the aligning process in one system, thus increasing productivity and reducing cost and time.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. An apparatus comprising:

a stage for moving a wafer in a first prescribed direction;

an aligner for aligning patterns exposed by a light onto the wafer; and a marking apparatus coupled to the aligner and using the light from the aligner for forming identification markings onto the wafer, wherein consecutive alignment and marking are performed in the apparatus.

2. The apparatus of claim 1, wherein an aligner comprises:

an illuminator for generating the light;

a reticle having the pattern for exposure by the light;

a reticle stage for moving said reticle in a second prescribed direction;

an alignment system for allowing alignment between the wafer and the pattern of said reticle; and a first lens for shrinking the pattern of said reticle by a prescribed ratio onto the wafer.

3. The apparatus of claim 2, wherein said marking apparatus comprises:

an optical cable guiding the light from said illuminator;

a shutter for blocking the light transmitted thereto for a prescribed period of time;

a mask module having identification markings for exposure onto the wafer;

a diffusion lens for diffusing the light transmitted thereto;

a mask stage for moving said mask module in a third prescribed direction; and a second lens for transmitting the light to the wafer.

4. The apparatus of claim 3, wherein said stage and said reticle stage move the wafer and reticle, respectively, in X, Y and $\theta$ directions, and said mask stage moves said mask module in the $\theta$ direction.

5. The apparatus of claim 3, wherein said shutter is located between said illuminator and said optical cable.

6. The apparatus of claim 1, wherein said marking apparatus comprises:

an optical cable for providing the light;

a shutter for blocking the light transmitted thereto for a prescribed period of time;

a mask module having identification markings for exposure onto the wafer;

a diffusion lens for diffusing the light transmitted thereto;

a mask stage for moving said mask module in a second prescribed direction; and a lens for transmitting the light to the wafer.

7. The apparatus of claim 6, wherein said stage moves the wafer in X, Y and $\theta$ directions, and said mask stage moves said mask module in the $\theta$ direction.

* * * * *